US006180504B1

(12) United States Patent
Farnworth et al.

(10) Patent No.: US 6,180,504 B1
(45) Date of Patent: Jan. 30, 2001

(54) METHOD FOR FABRICATING A SEMICONDUCTOR COMPONENT WITH EXTERNAL POLYMER SUPPORT LAYER

(75) Inventors: Warren M. Farnworth, Nampa; Alan G. Wood, Boise, both of ID (US)

(73) Assignee: Micron Technology, Inc., Boise, ID (US)

(*) Notice: Under 35 U.S.C. 154(b), the term of this patent shall be extended for 0 days.

(21) Appl. No.: 09/440,380

(22) Filed: Nov. 15, 1999

Related U.S. Application Data

(62) Division of application No. 09/384,783, filed on Aug. 27, 1999, now Pat. No. 6,118,129.

(51) Int. Cl.[7] ................................................. H01L 21/44
(52) U.S. Cl. ............................................. 438/612; 257/668
(58) Field of Search .................................... 438/612, 613, 438/623, 106, 123, 100, 121, 124, 597, 681; 257/688

(56) References Cited

U.S. PATENT DOCUMENTS

| | | |
|---|---|---|
| 5,674,785 | 10/1997 | Akram et al. . |
| 5,677,566 | 10/1997 | King et al. . |
| 5,739,585 | 4/1998 | Akram et al. . |
| 5,763,939 * | 6/1998 | Yamashita ............................ 257/668 |
| 5,783,461 | 7/1998 | Hembree . |
| 5,811,879 | 9/1998 | Akram . |
| 5,834,945 | 11/1998 | Akram et al. . |
| 5,885,849 * | 3/1999 | DiStefano et al. ................... 438/108 |
| 5,925,930 * | 7/1999 | Farnworth et al. .................. 257/737 |
| 5,956,605 * | 9/1999 | Akram et al. ........................ 438/613 |

OTHER PUBLICATIONS

Lau, John H. Ball Grid Array Technology, McGraw–Hill, Inc., United States, pp. 33,47,56,133,180,247,279,475,476–480 only.

Tummala, Rao R., "Chip–To–Package Interconnections", Micro–electronics Packaging Handbook, 1989, Van Nostrand Reinhold (publisher), New York, NY, pp. 366–368 only.

* cited by examiner

Primary Examiner—Matthew Smith
Assistant Examiner—Calvin Lee
(74) Attorney, Agent, or Firm—Stephen A. Gratton

(57) ABSTRACT

A semiconductor component includes a substrate, bonding pads on the substrate, and external contacts bonded to the bonding pads. Exemplary external contacts include solder balls, solder bumps, solder columns, TAB bumps and stud bumps. Preferably the external contacts are arranged in a dense array, such as a ball grid array (BGA), or fine ball grid array (FBGA). The component also includes a polymer support member configured to strengthen the external contacts, absorb forces applied to the external contacts, and prevent separation of the external contacts from the bonding pads. In a first embodiment, the polymer support member comprises a cured polymer layer on the substrate, which encompasses the base portions of the external contacts. In a second embodiment, the polymer support member comprises support rings which encompass the base portions of the external contacts. In either embodiment the polymer support member transfers forces applied to the external contacts away from the interface with the bonding pads, and into the center of the contacts.

6 Claims, 6 Drawing Sheets

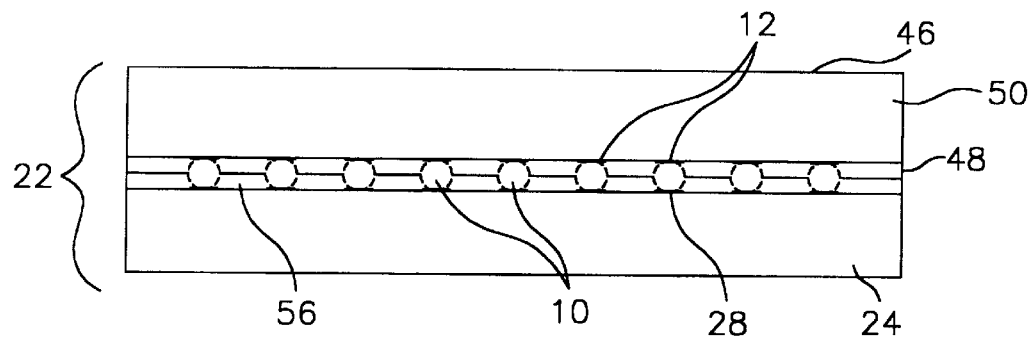
FIGURE 4
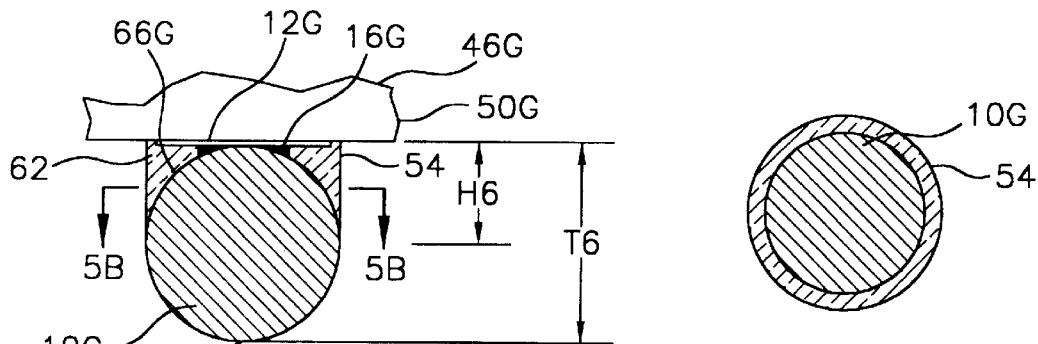
FIGURE 5A
FIGURE 5B
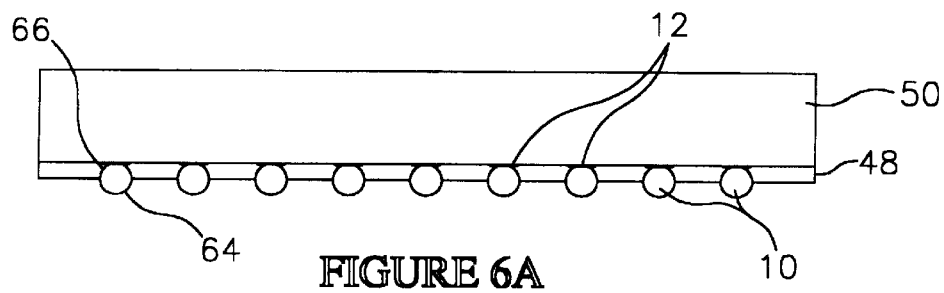
FIGURE 6A
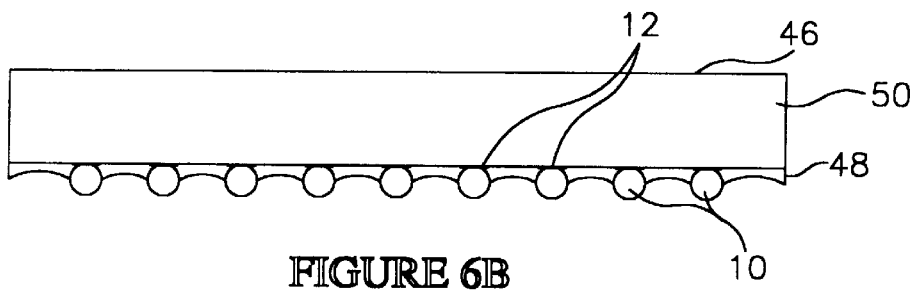
FIGURE 6B

METHOD FOR FABRICATING A SEMICONDUCTOR COMPONENT WITH EXTERNAL POLYMER SUPPORT LAYER

CROSS REFERENCE TO RELATED APPLICATIONS

This application is a division of patent application Ser. No. 09/384,783 filed on Aug. 27, 1999 now U.S. Pat. No. 6,118,129.

FIELD OF THE INVENTION

This invention relates generally to semiconductor manufacture, and more particularly to an improved semiconductor component, and to a method for fabricating the component.

BACKGROUND OF THE INVENTION

Semiconductor components, such as packages, dice and wafers can include external contacts in the form of solder contact balls. The contact balls are in electrical communication with integrated circuits, and other electrical elements, contained on the components. For some components, such as chip scale packages and BGA packages, the contact balls can be arranged in a dense grid array, such as a ball grid array (BGA), or a fine ball grid array (FBGA). The contact balls provide a high input/output capability for a component, and permit the component to be surface mounted to a supporting substrate, such as a printed circuit board (PCB).

FIG. 1A illustrates a contact ball 10A bonded to a bonding pad 12A on a semiconductor component 14A. In this example, the component 14A comprises a semiconductor package, such as a chip scale package, or a EGA package. The bonding pad 12A comprises a BGA pad formed on a backside of the component 14A out of a solderable metal such as molybdenum or copper.

One conventional method for attaching the contact ball 10A to the component 14A uses a solder reflow bonding process. With this method the contact ball 10A is formed separately out of a non-eutectic solder alloy such as 95% Pb/5% Sn, 60% Pb/40% Sn, 63% Sn/37% Pb, or 62% Pb/36% Sn/2% Ag. Typically, the contact ball 10A has the shape of a sphere, or a truncated sphere.

Initially, a layer of eutectic solder can be deposited on the bonding pad 12A using a suitable deposition process such as screen printing to form a eutectic solder fillet 16A. Typically, the eutectic solder is in the form of a paste. A platen can be used to hold the component 14A, while the eutectic solder is deposited on the bonding pad 12A.

Alternately, a flux (not shown) can be applied to the bonding pad 12A. The flux chemically attacks surface oxides, such that the molten solder can wet the surfaces to be bonded. The flux also performs a tacking function prior to solder reflow. Following application of the flux, the contact ball 10A can be placed on the bonding pad 12A in physical contact with the eutectic solder and flux. A fixture can be used to center and maintain the contact ball 10A on the eutectic solder paste and bonding pad 12A.

Following placement of the contact ball 10A on the bonding pad 12A, the component 14A can be placed in a furnace at a temperature sufficient to reflow the eutectic solder and form the fillet 16A. The eutectic solder fillet 16A metallurgically bonds the contact ball 10A to the bonding pad 12A. The component 14A can then be removed from the furnace and cooled. In addition, the excess flux can be removed from the exposed surfaces of the component 14A and the contact ball 10A, using a suitable cleaning agent.

Suitable furnaces for performing the reflow process include convection ovens and infrared ovens. Rather than an oven, the bonding process can be performed using a pulse-thermode, a hot-air thermode, or a laser. A solder ball bumper, for example, uses a laser to form the eutectic solder fillet 16A, and bond the contact ball 10A to the bonding pad 12A. Alternately, the contact ball 10A can be bonded to the bonding pad 12A by brazing, by welding, or by application of a conductive adhesive.

Following the bonding process, the component 14A can be surface mounted to a supporting substrate 24A, such as a printed circuit board (PCB), to form an electronic assembly 22A. For attaching the component 12A to the substrate 24A, a second eutectic solder fillet 26A bonds the contact ball 10A to a contact pad 28A on the supporting substrate 24A. A solder reflow process, as previously described, can be used to form the eutectic solder fillet 26A, and to bond the contact ball 10A to the contact pad 28A.

One factor that can adversely affect the reliability of the assembly 22A during operation in different customer environments is fatigue failure of the contact ball 10A, particularly at the interface of the contact ball 10A with the bonding pad 12A. Typically, fatigue failures are induced by thermal expansion mismatches between the component 14A and the supporting substrate 24A. For example, if the component 14A comprises a first material, such as ceramic having a first CTE, and the supporting substrate 24A comprises a second material, such as FR-4 having a second CTE, cyclic loads can be placed on the contact ball 10A as the assembly 22A is thermally cycled during normal operation.

The forces acting on the contact ball 10A include tensile forces 30, moment forces 32, 34 and shear forces 36. If these forces are large enough, the contact ball 10A can separate from the bonding pad 12A on the component 14A. This separation can form an electrical open in the electrical path between the contact ball 10A and the bonding pad 12A on the component 14A. This separation also compromises the physical bond between the component 14A and the supporting substrate 24A. This problem is compounded because the area of interface between the contact ball 10A and the bonding pad 12A is relatively small. The forces are thus concentrated over a relatively small area.

FIGS. 1B–1F illustrate other types of components in which separation can occur between an external contact and a bonding pad on the component. In FIG. 1B, a component 14B includes a bonding pad 12B and a contact bump 10B formed on the bonding pad 12B. In addition, the contact bump 10B is bonded directly to a contact pad 28B on a supporting substrate 24B. In this example, the contact bump 10B can be formed on the bonding pad 12B using a deposition process, such as evaporation of a ball limiting metallurgy (BLM) and solder material through openings in a metal mask. In addition to the contact bump 10B, the ball limiting metallurgy (BLM) can include a multi layered stack (not shown) such as an adherence layer (e.g., Cr), a solderable layer (e.g., Cu) and a flash layer (e.g., Au). This process is also known as C4 technology, and is typically used to deposit contact bumps 10B directly onto aluminum bond pads on a semiconductor wafer or die. Alternately, other deposition processes, such as electroless deposition, or electrolytic deposition can be used to form the contact bump 10B. The contact bumps 10B can also comprise a pre-formed eutectic ball, which is placed on the contact pad 28B and reflowed, substantially as previously described for the non-eutectic contact ball 10A. In this case flux can be employed or reflow can be performed in an inert atmosphere.

In FIG. 1C, a component 14C includes a bonding pad 12C and a solder contact column 10C bonded to the bonding pad 12C using a eutectic solder fillet 16C. This type of component 14C is sometimes referred to as a ceramic column grid array (CCGA). The contact column 10C comprises an elongated member configured for bonding to a contact pad 28C on a supporting substrate 24C using a eutectic solder fillet 26C.

In FIG. 1D, a component 14D includes a TAB contact bump 10D bonded to a multi layered tape 38, that is similar to TAB tape. This type of component 14D is sometimes referred to as a TAB ball grid array (TBGA). For surface mounting the component 14D, the TAB contact bump 10D is configured for bonding to a contact pad 28D on a supporting substrate 24D using a eutectic solder fillet 26D.

In FIG. 1E, a component 14E includes a solder mask 40 having an opening 42 in which a solder mask contact ball 10E is formed. The opening 42 in the solder mask 40 facilitates alignment and bonding of the contact ball 10E to a bonding pad 12E on the component 14E. In addition in the completed assembly, the solder mask 40 insulates the contact ball 10E from adjacent contact balls 10E and other electrical elements on the component 14E, such as conductive traces. For surface mounting the component 14E, the contact ball 10E is configured for bonding to a contact pad 28E on a supporting substrate 24E using a solder fillet 26E.

In FIG. 1F, a component 14F includes a polymer tape 44 having a double sided stud contact bump 10F which comprises plated studs and a metal filled via in the polymer tape 44. The stud contact bump 10F is bonded to a bonding pad 12F on the component 14F using a eutectic solder fillet 16F. In addition, the stud contact bump 10F is bonded to a contact pad 28F on a supporting substrate 24F.

The present invention is directed to an improved semiconductor package in which external contacts on the component are rigidified by a separate polymer support member.

SUMMARY OF THE INVENTION

In accordance with the present invention, an improved semiconductor component, and a method for fabricating the component are provided. The semiconductor component can comprise a package, a die, or a wafer configured for surface mounting to a supporting substrate, such as a printed circuit board, to form an electronic assembly.

The component includes a substrate, and external contacts on a surface of the substrate in electrical communication with integrated circuits, or other electrical elements on the component. The external contacts can comprise contact balls, contact bumps, contact columns, TAB contact balls, or stud contact bumps. The external contacts include base portions bonded to bonding pads on the substrate, and tip portions configured for bonding to contact pads on the supporting substrate.

The component also includes a polymer support member on the substrate configured to rigidify, and absorb forces acting on the external contacts in the electronic assembly. In a first embodiment the polymer support member comprises a single polymer layer on the surface of the substrate that encompasses the base portions of the external contacts. The polymer layer can comprise a resilient, curable material that adheres to the base portions. In addition, the polymer layer can be formed with a thickness approximately equal to one fourth to one half the height of the external contacts, such that forces are transmitted away from the bonded connections with the bonding pads on the substrate, and redistributed across the bulk volume of the external contacts.

In a second embodiment the polymer support member comprises a plurality of separate polymer support rings. Each polymer support ring surrounds a base portion of an external contact, and has a thickness approximately equal to one fourth to one half the height of the external contact. Preferably, the polymer support rings are formed of a photoimageable material, such as a thick film resist, such that a photo patterning process can be used to form the polymer support rings. In this embodiment the polymer support rings absorb and redistribute forces exerted on the external contacts, particularly forces occurring at the bonded connections with the substrate.

A method for fabricating the first embodiment polymer support member includes the steps of blanket depositing a polymer layer on the surface of the substrate to a thickness approximately equal to one half the height of the external contacts, and then curing the polymer layer.

A method for fabricating the second embodiment polymer support member includes the steps of: providing a component substrate having a plurality of contact balls, blanket depositing a photoimageable material on the surface of the substrate and the contact balls, directing an exposure energy towards the photoimageable material and the contact balls, and then developing the photoimageable material to form polymer support rings circumjacent to base portions of the contact balls. During the exposure step the photoimageable material in spaces between the contact balls and the substrate is protected by the contact balls and remains unexposed for defining the polymer support rings.

BRIEF DESCRIPTION OF THE DRAWINGS

FIG. 4 is a schematic side elevation view of an electronic assembly assembled using a component constructed in accordance with the invention;

FIG. 5A is an enlarged cross sectional view equivalent to FIG. 3A of an alternate embodiment polymer support ring reinforcing a contact ball on a semiconductor component;

FIG. 5B is a cross sectional view of the polymer support ring taken along section line 5B—5B of FIG. 5A:

FIGS. 6A–6B are schematic cross sectional views illustrating steps in a method for fabricating the semiconductor component with a polymer layer as in FIG. 2A.

DETAILED DESCRIPTION OF THE PREFERRED EMBODIMENT

Figure 2A:
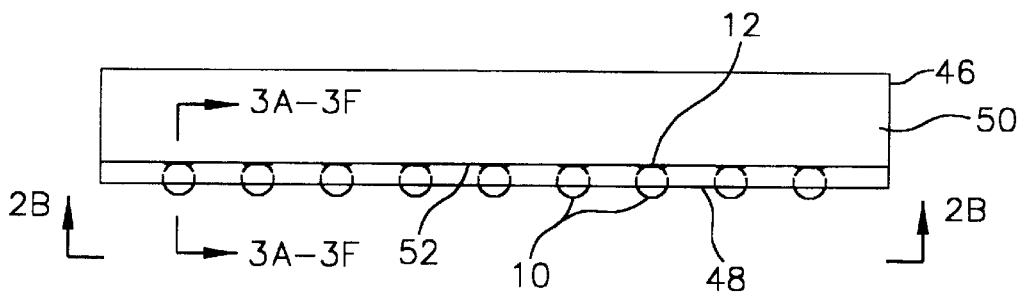
FIG. 2A is a side elevation view of a semiconductor component constructed in accordance with the invention.
Figure 2B:
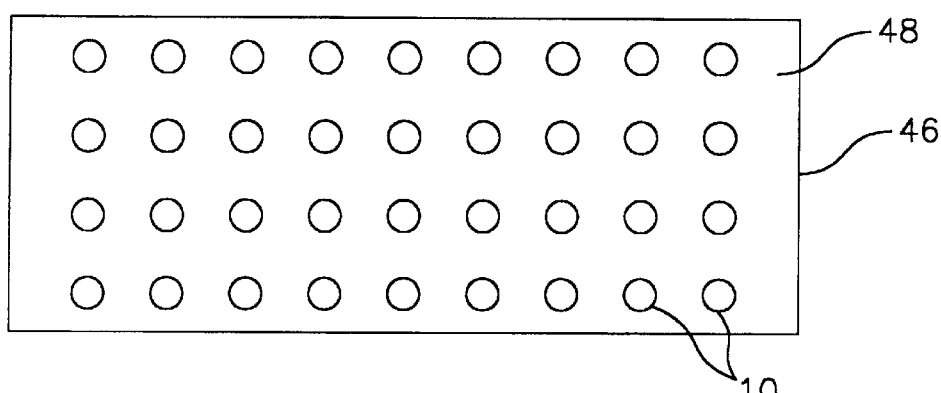
FIG. 2B is a bottom view of the component taken along line 2B—2B of FIG. 2A.

Referring to FIGS. 2A and 2B, a semiconductor component 46 constructed in accordance with the invention is illustrated. As used herein the term "semiconductor component" refers to an element, or an assembly, that includes a semiconductor die. By way of example, the semiconductor component 46 can comprise a chip scale package, a BGA device, a bare semiconductor die, a semiconductor wafer containing semiconductor dice, or a panel or wafer containing semiconductor packages.

The component 46 includes a substrate 50, and a plurality of bonding pads 12 and external contacts 10 formed on a surface 52 of the substrate 50. Representative materials for the component substrate 50 include ceramic, silicon, and glass filled plastics such as FR-4. Representative materials for the bonding pads 12 include molybdenum, copper and nickel. As will be further explained, the external contacts 10 can comprise any of the embodiments shown in FIGS. 1A–1F. The external contacts 10 are in electrical communication with integrated circuits, and other electrical elements, contained on the component 46.

In addition, the external contacts 10 can be arranged in a dense grid array, such as a ball grid array (BGA), or a fine ball grid array (FBGA). For illustrative purposes the external contacts are shown in array of four rows and nine columns. However, the array can include as many, or as few, rows and columns of external contacts 10 as required, and can include from several to hundreds, or more, external contacts 10. In addition, a pitch of the external contacts 10 can be selected as required. For example, for fine ball grid array (FGBA) components, the external contacts 10 can have a center to center pitch as small as about 0.004-in (0.100 mm) or smaller.

The component 46 also includes a polymer support member in the form of a polymer layer 48 formed on the surface 52 of the substrate 50. The polymer layer 48 is configured to support the external contacts 10, and to rigidify and strengthen the bonding of the external contacts 10 to the bonding pads 12 on the component 46. In an electronic assembly 22 (FIG. 4) constructed using the component 46, the polymer layer 48 absorbs forces acting on the external contacts 10. In addition, the polymer layer 48 transfers forces occurring at the interfaces of the external contacts 10 with the bonding pads 12 and redistributes the forces into the center, or full volume, of the external contacts 10.

Figure 3A:
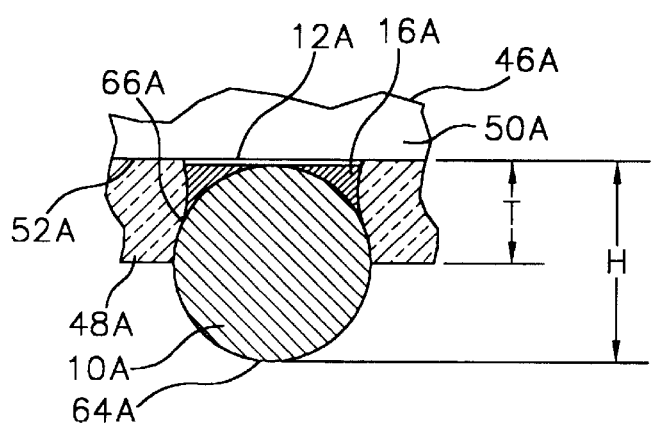
FIG. 3A is an enlarged cross sectional view taken along section line 3A—3A of FIG. 2A illustrating a contact ball on the component reinforced with a polymer layer.

Referring to FIGS. 3A–3F, several different embodiments for the component 46 and external contacts 10 are illustrated. In FIG. 3A, a component 46A includes a substrate 50A, bonding pads 12A on the substrate 50A, and contact balls 10A bonded to the bonding pads 12A using eutectic solder fillets 16A. The contact balls 10A can comprise solder balls constructed and bonded to the bonding pads 12A on the substrate 50A, substantially as previously described and shown in FIG. 1A.

As also shown in FIG. 3A, the component 46A includes a polymer layer 48A configured to strengthen and rigidify the contact balls 46A. The polymer layer 48A has a thickness T that is less than a height H of the contact balls 10A. This permits tip portions 64A of the contact balls 10A to be bonded to mating contact pads 28 (FIG. 4) on a supporting substrate 24 (FIG. 4). In addition, with the thickness T less than the height H, an underfill layer 56 (FIG. 4) can be placed between the component 46A and the supporting substrate 24 (FIG. 4), if desired.

In the illustrative embodiment, the thickness T of the polymer layer 48A is approximately one half the height H of the contact balls 10A (T=½*H). With this thickness, the surface of the polymer layer 48A will be coincident to a plane through the diameters and centers of the contact balls 10A. However, the thickness T can also be less than one half the height H, with one fourth to one half being preferred. A representative range for the height "H" of the contact balls 10A can be from about 0.004-in (0.100 mm) to 0.030-in (0.762 mm). A representative range for the thickness T of the polymer layer 48A can be from about 0.002-in (0.050 mm) to 0.025-in (0.635 mm).

Preferably, the polymer layer 48A comprises a resilient material that adheres to, and encompasses base portions 66A of the contact balls 10A, such that forces can be efficiently absorbed by the polymer layer 48A, and transmitted away from the interface of the contact balls 10A with the bonding pads 12A. As used herein the term "base portions" refers to portions of the contact balls 10A configured for bonding to the bonding pads 12A. The term "tip portions" refers to exposed portions of the contact balls 10A configured for bonding to contact pads 28 (FIG. 4) on a supporting substrate 24 (FIG. 4).

Preferably, the polymer layer 48A comprises a curable material, such as polyimide, that can be deposited in viscous form, and then cured to harden. As will be further explained, the polymer layer 48A can also comprise a photoimageable material, such as a thick film resist, to permit blanket deposition, and then removal from selected portions of the surface 52A of the component substrate 50A by development of the material.

Figure 1A:
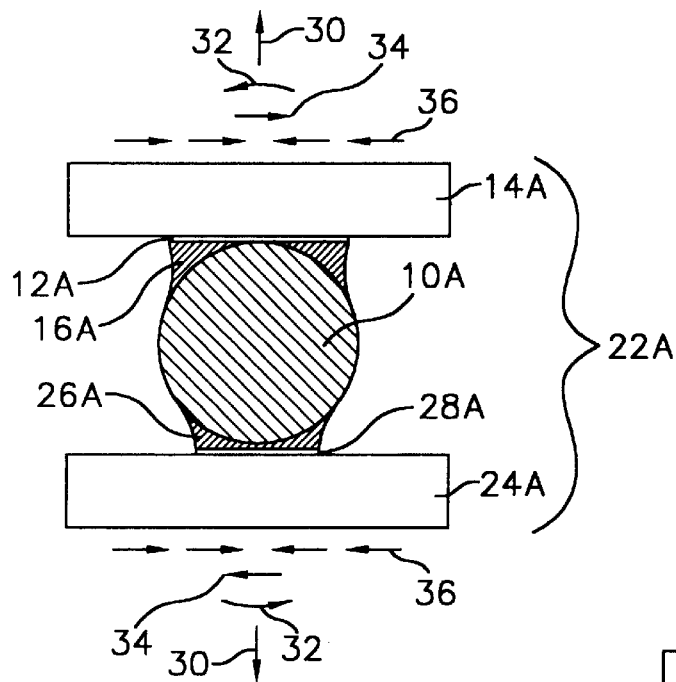
FIG. 1A is an enlarged schematic cross sectional view of a prior art contact ball on a semiconductor component bonded to a supporting substrate in an electronic assembly.
Figure 1B:
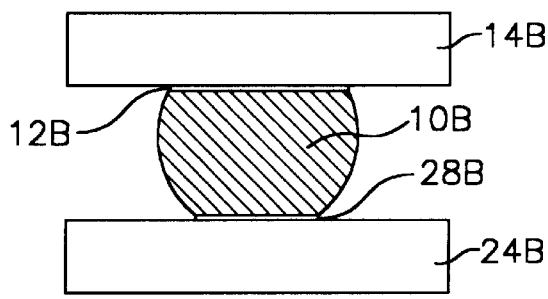
FIG. 1B is an enlarged schematic cross sectional view equivalent to FIG. 1A of a prior art contact bump.
Figure 3B:
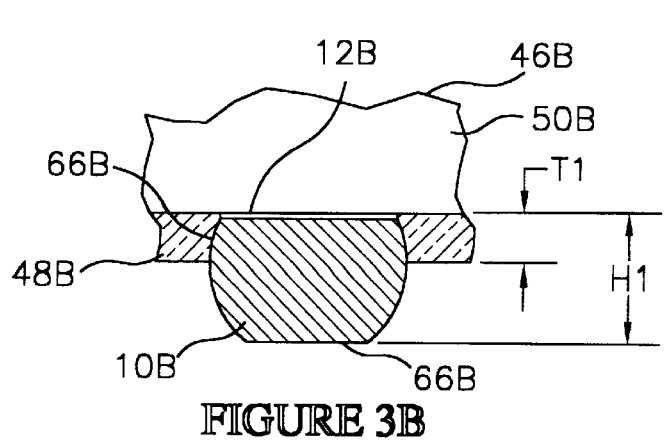
FIG. 3B is an enlarged cross sectional view taken along section line 3B—3B of FIG. 2A illustrating an alternate embodiment contact bump on the component reinforced with a polymer layer.

Referring to FIG. 3B, an alternate embodiment component 46B includes contact bumps 10B formed on bonding pads 12B on a component substrate 50B, substantially as previously described, and shown in FIG. 1B. In addition, the component 46B includes a polymer layer 48B that adheres to and encompasses base portions 66B of the contact bumps 10B. The polymer layer 48B has a thickness T1 that is less than a height H1 of the contact bumps 10B such that tip portions of the contact bumps 10B are left exposed for bonding. In the illustrative embodiment the thickness T1 is about one half the height H1 such that a surface of the polymer layer 48B is coincident to a plane through the centers of the contact bumps 10B. However, the thickness T1 can be less than one half the height with from one fourth to one half being preferred.

Figure 1C:
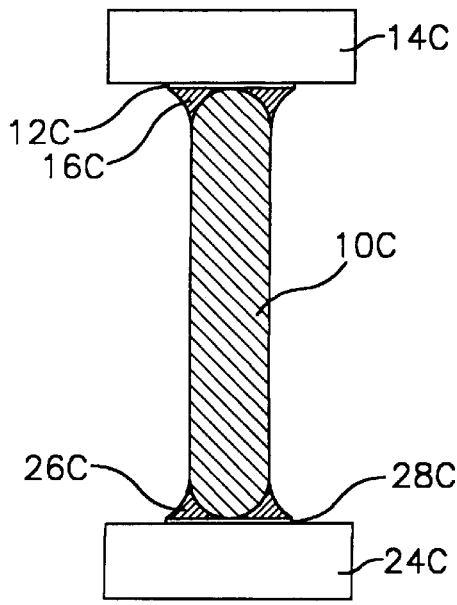
FIG. 1C is an enlarged schematic cross sectional view equivalent to FIG. 1A of a prior art contact column.
Figure 3C:
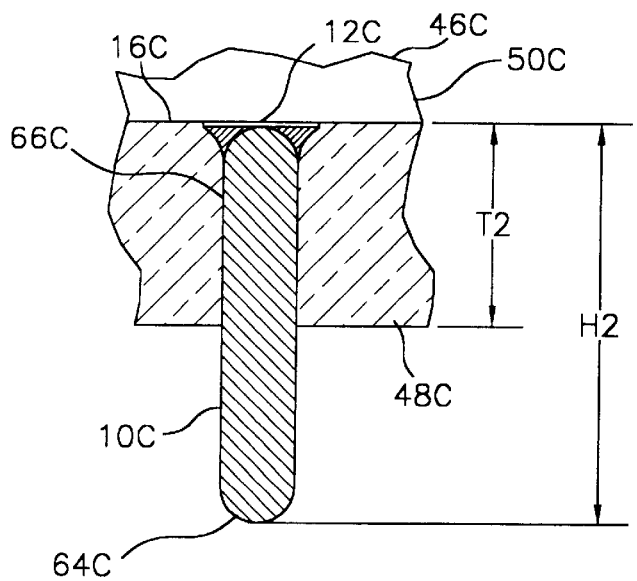
FIG. 3C is an enlarged cross sectional view taken along section line 3C—3C of FIG. 2A illustrating an alternate embodiment contact column on the component reinforced with a polymer layer.

Referring to FIG. 3C, an alternate embodiment component 46C includes contact columns 10C formed on bonding pads 12C on a component substrate 50C, substantially as previously described, and shown in FIG. 1C. In addition, the component 46C includes a polymer layer 48C that adheres to and encompasses base portions 66C of the contact columns 10C. The polymer layer 48C has a thickness T2 that is less that a height H2 of the contact: columns 10C such that tip portions 64C of the contact columns 10C are exposed for bonding. In FIG. 3C, the thickness T2 is about one half the height H2. However, as the contact columns 10C are elongated structures with heights of greater than 0.060-in (1.524 mm), the thickness T2 can be substantially less than one half the height H2 (e.g., one fourth the height H2 or less) and still perform adequately.

Figure 1D:
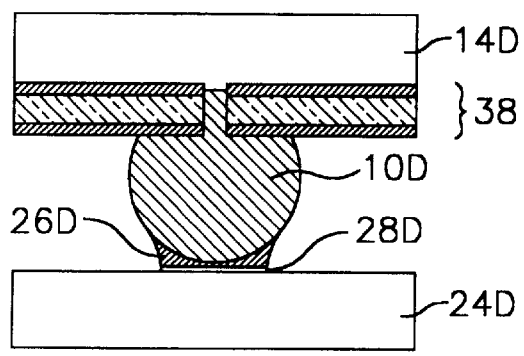
FIG. 1D is an enlarged schematic cross sectional view equivalent to FIG. 1A of a prior art TAB contact bump.
Figure 3D:
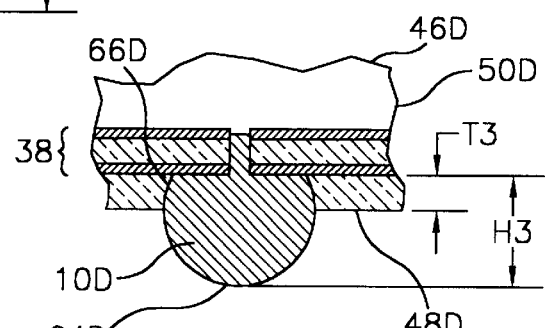
FIG. 3D is an enlarged cross sectional view taken along section line 3D—3D of FIG. 2A illustrating an alternate embodiment TAB contact ball on the component reinforced with a polymer layer.

Referring to FIG. 3D, an alternate embodiment component 46D includes TAB contact bumps 10D formed on multi layered TAB tape 38, substantially as previously described and shown in FIG. 1D. In addition, the component 46D includes a polymer layer 48D that adheres to the TAB tape 38 and encompasses base portions 66D of the contact bumps 10D on the polymer tape 38. The polymer layer 48D has a thickness T3 that is less than a height H3 of the contact bumps 10D such that tip portions 64D of the contact bumps 10D are exposed for bonding. Preferably the thickness T3 is about one fourth to one half the height H3 or less.

Figure 1E:
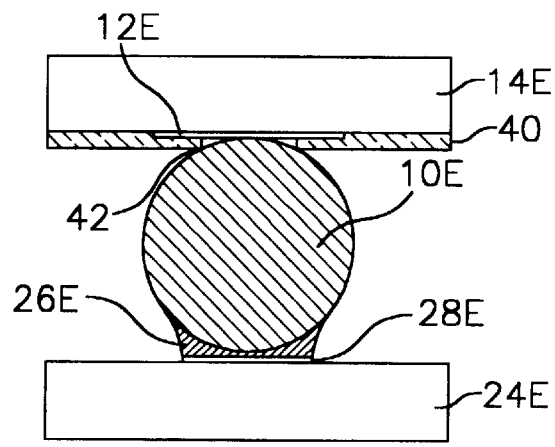
FIG. 1E is an enlarged schematic cross sectional view equivalent to FIG. 1A of a prior art solder mask contact ball.
Figure 3E:
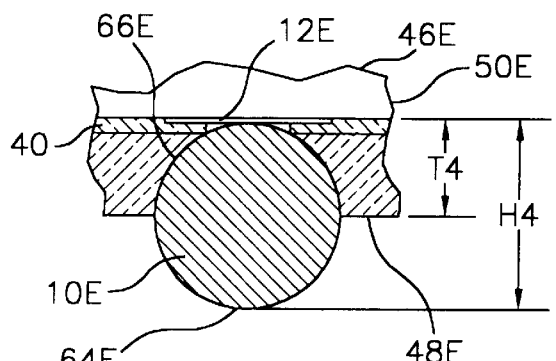
FIG. 3E is an enlarged cross sectional view taken along section line 3E—3E of FIG. 2A illustrating an alternate embodiment solder mask contact ball on the component reinforced with a polymer layer.

Referring to FIG. 3E, an alternate embodiment component 46E includes contact balls 10E formed on bonding pads 12E in openings in a solder mask 40 on a component substrate 50E, substantially as previously described, and shown in FIG. 1E. In addition, the component 46E includes a polymer layer 48E bonded to the solder mask 40 and encompassing base portions 66E of the contact balls 10E. The polymer layer 48E has a thickness T4 that is less than a height H4 of the contact balls 10E such that tip portions 64E of the contact balls 10E are exposed for bonding. Preferably the thickness T4 is about one fourth to one half the height H4.

Figure 1F:
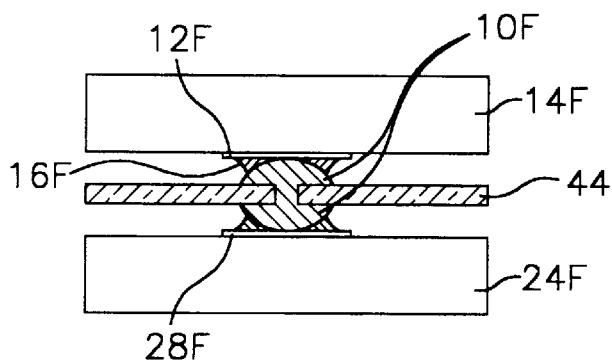
FIG. 1F is an enlarged schematic cross sectional view equivalent to FIG. 1A of a prior art stud contact bump on a polymer tape.
Figure 3F:
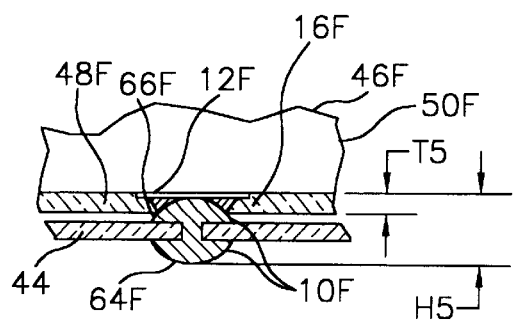
FIG. 3F is an enlarged cross sectional view taken along section line 3F—3F of FIG. 2A illustrating an alternate embodiment stud contact bump on the component reinforced with a polymer layer.

Referring to FIG. 3F, an alternate embodiment component 46F includes stud contact bumps 10F formed on polymer film 44 on a component substrate 50F, substantially as previously described, and shown in FIG. 1F. In addition, the component 46F includes a polymer layer 48F that adheres to the component substrate 50F and encompasses base portions 66F of the stud contact bumps 10F. The polymer layer 48F has a thickness T5 that is less than a height H5 of the stud contact bumps 10F such that tip portions 64F of the stud contact bumps 10F are exposed for bonding. Preferably the thickness T5 is about one fourth to one half the height H5.

Referring to FIG. 4, the component 46 is shown surface mounted to a supporting substrate 24 to form an electronic assembly 22. In the assembly 22, the external contacts 10 on the component 46 are bonded to contact pads 28 on the supporting substrate 24 substantially as previously described. In addition, an underfill layer 56 optionally fills the gap between the component 46 and the supporting substrate 24. Also in the assembly, the polymer layer 48 strengthens and rigidifies the bonding of the external contacts 10, to the bonding pads 16 on the component substrate 50. Further, the polymer layer 48 absorbs and resists forces acting on the external contacts 10, such that separation from the bonding pads 16 is less likely to occur.

Referring to FIG. 5A, an alternate embodiment semiconductor component 46G includes a substrate 50G, and a plurality of bonding pads 12G on the substrate 50G. In addition, the component 46F includes a plurality of contact balls 10G bonded to the bonding pads 12G. The component 46G also includes a polymer support member in the form of a plurality of polymer rings 54 configured to support and rigidify the contact balls 10G.

In the component 46G, the contact balls 10G are initially attached to the bonding pads 12G such that spaces 62 are present between base portions 66G of the contact balls 10G and the bonding pads 12G. This configuration can be achieved by bonding the contact balls 10G to the bonding pads 12G using a eutectic solder fillet 16G. This configuration can also be achieved by forming the contact balls 10G directly on the bonding pads 12G using a deposition process such as electroless or electrodeposition, or by using preformed eutectic balls substantially as previously described.

The polymer rings 54 substantially fill the spaces 62 between the contact balls 10G and bonding pads 12G. In addition, the polymer rings function substantially as previously described for polymer layer 48 to strengthen and rigidify the bonds to the contact balls 10G. In this embodiment a thickness T6 of the polymer rings 54 is approximately equal to one half a height H6 of the contact balls 10G such that tip portions 64G of the contact balls 10G remain exposed for bonding. Preferably the thickness T6 of the polymer rings 54 is from one fourth to one half the height H6 of the contact balls 10G. The polymer rings 54 can be formed with this thickness using a photoimageable polymer, and a developing process to be hereinafter described.

Referring to FIGS. 6A and 6B, a method for fabricating the semiconductor component 46 with the polymer layer 48 is illustrated. Initially, as shown in FIG. 6A, the component substrate 50 can be provided with the external contacts 10 bonded to the bonding pads 16. The external contacts 10 on the component substrate 50 can be in one of the configurations shown in FIGS. 3A–3F, or any other conventional configuration. In addition, any conventional bonding process such as solder reflow, laser reflow, welding, brazing, or conductive adhesive bonding, can be used to bond the external contacts 10 to the bonding pads 16.

Preferably the component substrate 50 is provided as a wafer, a panel, a strip, or a leadframe, containing multiple substrates 50. Following the fabrication process, the component 46 can be singulated using a suitable process such as cutting, shearing or etching.

As also shown in FIG. 6A, the polymer layer 48 can be blanket deposited on the component substrate 50 in a viscous state. Suitable materials for the polymer layer 48 include curable polymers such as polyimide, silicone, epoxy, and thick film resists. A thickness of the polymer layer 48 can be selected substantially as previously described. This thickness can be controlled by dispensing a required volume of material onto the substrate 50, and then spinning if required, using a suitable apparatus, such as a spin coater or meniscus coater. In addition, the deposition process can be controlled such that the polymer layer 48 adheres to the base portions 66 of the external contacts 10, but does not completely cover the tip portions 64, substantially as previously described.

As shown in FIG. 6B, following deposition of the viscous material a curing step can be performed to cure the polymer layer 48. Depending on the polymer, the curing step can be performed by heating the polymer layer 48 to a required temperature for a required time period. For some materials, such as epoxies, the curing process can be performed by outgassing of a solvent. As also shown in FIG. 6B, the polymer layer 48 can cure with a curved, or meniscus shape, during adherence to the base portions 66 of the external contacts 10.

Figure 7A:
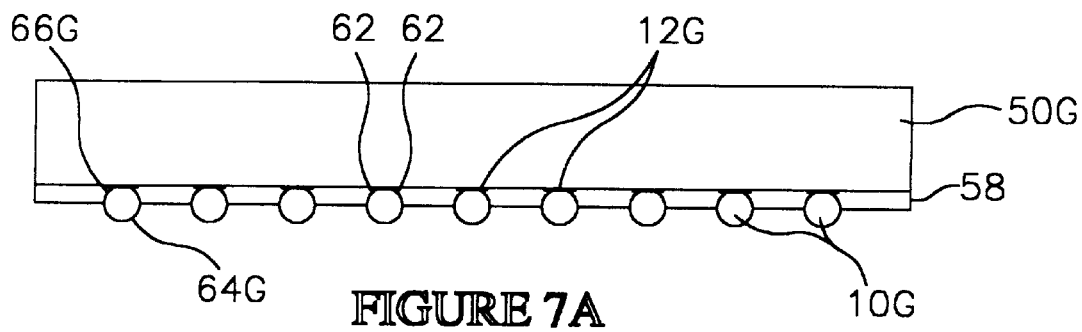
FIGS. 7A–7C are schematic cross sectional views illustrating steps in a method for fabricating the semiconductor component with polymer rings as in FIG. 5A.
Figure 7B:
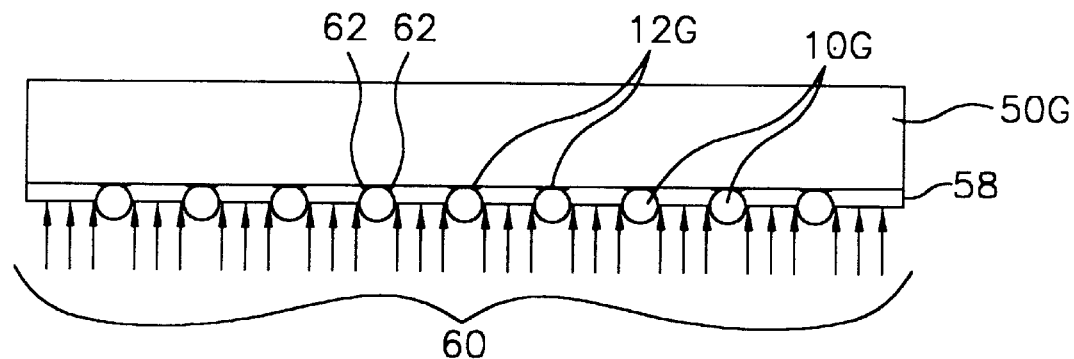
Figure 7C:
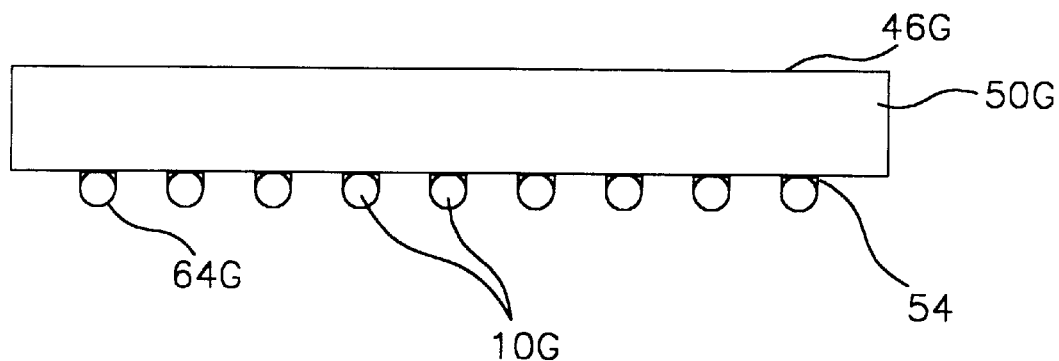

Referring to FIGS. 7A–7C, steps in a method for fabricating the component 46G with polymer rings 54 are illustrated. Initially, as shown. in FIG. 7A, the component substrate 50G can be provided. As with the prior process, this fabrication process is preferably performed on multiple substrates 50G contained on a wafer, a panel, a strip or a leadframe. In this embodiment the external contacts comprise contact balls 10G that are bonded to the bonding pads 12G, such that spaces 62 are present between the curved base portions 66G of the contact balls 10G, and the bonding pads 12G. Such a configuration can be achieved by bonding the contact balls 10G using eutectic solder fillets 16G (FIG. 5A). Such a configuration can also be achieved by forming the contact balls 10G directly on the bonding pads 12G using a deposition process such as electroless or electrodeposition through openings in a mask, or by using eutectic solder balls substantially as previously described.

As also shown in FIG. 7A, a thick film resist 58 can be blanket deposited on the component substrate 50G, on the contact balls 10G and in the spaces between the contact balls 10G. One suitable thick film resist is a negative tone resist sold by Shell Chemical under the trademark "EPON RESIN SU-8". The resist can be deposited in layers to a thickness of from about 3–50 mils. The resist also includes an organic solvent (e.g., gamma-butyloracton), and a photoinitiator. A conventional resist coating apparatus, such as a spin coater, or a meniscus coater, can be used to deposit the resist in viscous form onto the substrate 50G. The deposited resist can then be partially hardened by heating to about 95° C. for about 15 minutes or longer.

Next, as shown in FIG. 7B, the resist 58 can be exposed using an exposure energy 60. Exposure of the resist 58 can be performed with a conventional UV mask writer using a suitable UV dose. A representative UV dose for the previously described resist formulation is about 165 mJ/cm$^2$. During the exposure process the resist present in the spaces 62 is "shadowed" or "protected" by the contact balls 10G such that this material remains unexposed.

Next, as shown in FIG. 7C, the resist 58 can be developed using a suitable developer. One suitable developer for developing the previously described resist formulation is a solution of PGMEA (propyleneglycol-monomethyletheracetate). Developing of the resist 58 forms the support rings 54 leaving the tip portions 64G exposed for bonding. Following development, the support rings 54 can be fully hardened. A "full cure" can be performed with a hard bake at about 200° C. for about 30 minutes.

Thus the invention provides an improved semiconductor component and method of fabrication. The component includes external contacts and a polymer support member designed to strengthen and rigidify the external contacts.

While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:

providing a substrate comprising a plurality of external contacts comprising base portions and tip portions;

forming a photoimageable polymer layer on the substrate substantially surrounding and adhering to the base portions;

exposing the polymer material using an exposure energy directed at the balls and the polymer material; and following the exposing step, developing unexposed polymer material proximate to the base portions to form polymer rings substantially surrounding the base portions.

2. A method for fabricating a semiconductor component comprising:

providing a substrate comprising a plurality of pads and a plurality of contact balls on the pads comprising base portions and tip portions, the base portions and the pads configured to form spaces therebetween, the tip portions configured for bonding to a second substrate;

depositing a photoimageable polymer material on the substrate to substantially surround the base portions and fill the spaces;

exposing the polymer material using an exposure energy directed at the balls and at the polymer material such that the polymer material within the spaces is protected by the balls and remains unexposed; and developing the polymer material to form polymer rings within the spaces substantially surrounding the base portions.

3. The method of claim 2 wherein the polymer material comprises a photoimageable resist.

4. The method of claim 2 wherein the contact balls comprise a ball grid array or a fine ball grid array.

5. The method of claim 2 wherein the component comprises an element selected from the group consisting of semiconductor packages, semiconductor dice, semiconductor wafers and BGA devices.

6. A method for fabricating a semiconductor component comprising:

providing a substrate comprising a plurality of pads and a plurality of external contacts comprising base portions bonded to the pads and tip portions configured for bonding to a second substrate;

depositing a photoimageable polymer material on the substrate which substantially surrounds the base portions;

exposing the polymer material using an exposure energy directed at the balls and at the polymer material such that at least some of the polymer material is protected by the balls and remains unexposed polymer material; and developing the unexposed polymer material to form polymer rings substantially surrounding the base portions.

* * * * *